United States Patent [19]
Sandhu et al.

[11] Patent Number: 5,965,932
[45] Date of Patent: Oct. 12, 1999

[54] CONTAMINATION FREE SOURCE FOR SHALLOW LOW ENERGY JUNCTION IMPLANTS USING IMPLANTED MOLECULES CONTAINING TITANIUM AND BORON

[75] Inventors: Gurtej S. Sandhu; Mohammed Anjum, both of Boise, Id.

[73] Assignee: Micron Technology, Inc., Boise, Id.

[21] Appl. No.: 09/073,257

[22] Filed: May 5, 1998

Related U.S. Application Data

[62] Division of application No. 08/863,993, May 27, 1997, Pat. No. 5,891,791.

[51] Int. Cl.$^6$ .................................................. H01L 21/265
[52] U.S. Cl. ............................................ 257/607; 257/770
[58] Field of Search ............................... 438/252, 231, 438/526, 527; 257/655, 607, 770

[56] References Cited

U.S. PATENT DOCUMENTS

| | | | |
|---|---|---|---|
| 5,086,016 | 2/1992 | Brodsky et al. | 438/190 |
| 5,170,242 | 12/1992 | Stevens et al. | 257/751 |
| 5,306,408 | 4/1994 | Treglio | 204/192.38 |
| 5,330,921 | 7/1994 | Yoshida et al. | 437/25 |
| 5,700,716 | 12/1997 | Sharan et al. | 438/190 |
| 5,745,990 | 5/1998 | Lee et al. | 29/852 |

OTHER PUBLICATIONS

Choi et al., "Stability of TiB2 as a Diffusion Barrier on Silicon", J. Electrochem. Soc. vol. 138, No, Oct. '91.

*Primary Examiner*—Wael M. Fahmy
*Assistant Examiner*—Kurt Eaton
*Attorney, Agent, or Firm*—Fletcher, Yoder & Van Someren

[57] ABSTRACT

A method for forming a P-type region in a semiconducting crystalline substrate by ion implantation is disclosed, wherein the implant species is an ionic molecule that contains titanium and boron.

10 Claims, 2 Drawing Sheets

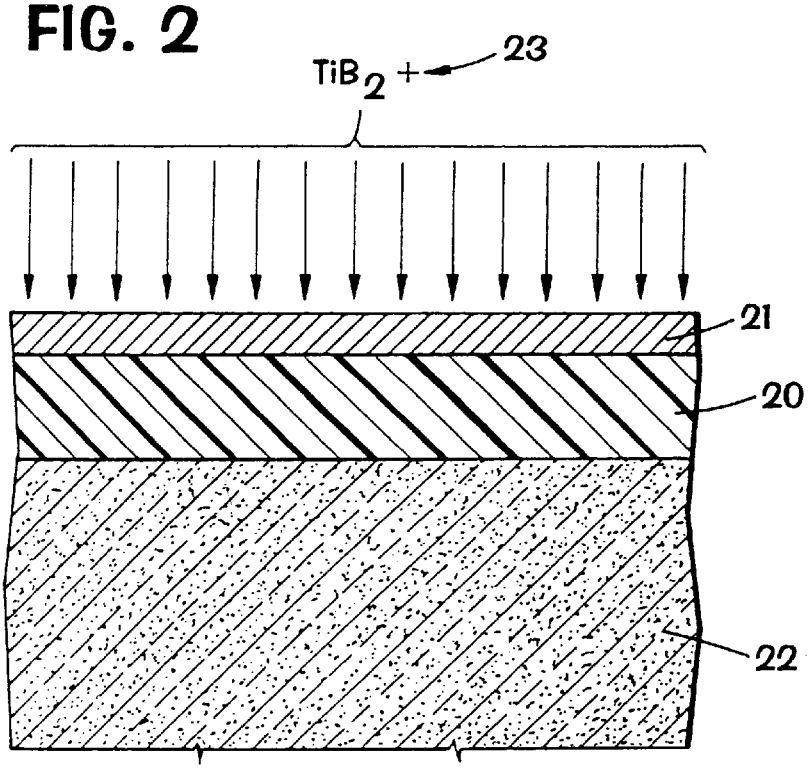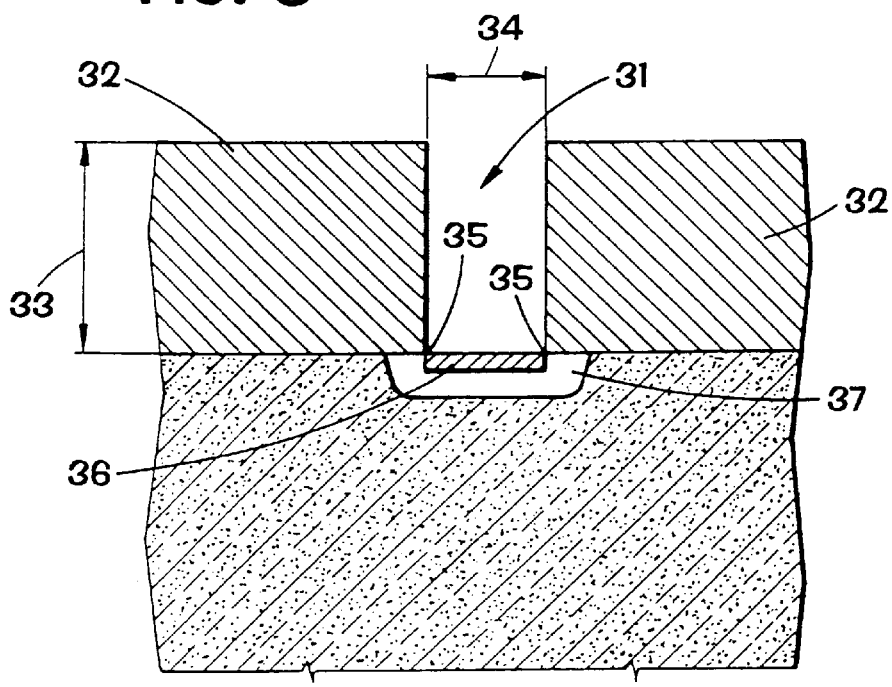

CONTAMINATION FREE SOURCE FOR SHALLOW LOW ENERGY JUNCTION IMPLANTS USING IMPLANTED MOLECULES CONTAINING TITANIUM AND BORON

This application is a Divisional of application Ser. No. 08/863,993 filed May 27, 1997, U.S. Pat. No. 5,891,791.

BACKGROUND OF THE INVENTION

1. Field Of The Invention

This invention relates generally to the field of integrated circuit manufacturing and, more particularly, to ion implantation.

2. Description Of The Related Art

Ion implantation is a well known technique for forming junctions in semiconductors. During ion implantation, a source material is used to produce ions which are ultimately implanted into a silicon wafer. Where the ions become embedded in the silicon, they change the silicon's electrical properties. If an N-type source material is used (e.g., one containing phosphorous), the resulting silicon will become N-type, or rich with electrons. If a P-type source material is used (e.g., one containing boron), the resulting silicon will become P-type, or rich with "holes."

P-type junctions have traditionally been manufactured by the use of a boron-based source gas, usually boron trifluoride, or $BF_3$. Inside of an ion implantation machine, the source gas is ionized, creating, amongst other species, $BF_2^+$ ions. In traditional Ultra Large Scale Integration (ULSI) applications requiring P-type junctions, the $BF_2^+$ species is used as the implant species in the formation of boron-doped, P-type junctions. The $BF_2^+$ species can be extracted by adjusting the field strength of extractor magnet inside of the ion implanter so as to choose an ion species of the desired charge-to-mass ratio.

However, using the $BF_2^+$ ion as the implant species has its drawbacks. Most importantly, molybdenum is usually present in ion implantation machine components and acts as a source of contamination. An ionized molybdenum ion, $Mo^{++}$, has approximately the same charge-to-mass ratio as the $BF_2^+$ species. Therefore, if $Mo^{++}$ ions are present in the ion plasma, the magnet will be unable to extract the desired $BF_2^+$ species without also extracting the $Mo^{++}$ species. As a result, any ionized molybdenum will be implanted into the silicon along with the $BF_2^+$ species. Unfortunately, the presence of molybdenum degrades the performance of the P-type junctions formed, because the presence of molybdenum in the junction will increase the junction's reverse bias leakage. In DRAM technologies, for instance, increased reverse bias leakage degrades refresh characteristics. Junction degradation issues become particularly acute in the ULSI era, which demands shallow junctions of high purity.

SUMMARY OF THE INVENTION

In accordance with one aspect of the present invention, there is provided a method for forming a P-type region in a substrate. The method includes the steps of implanting a species of ionic molecule containing titanium and boron into the substrate, and annealing the substrate to cause the boron to dissociate with the titanium.

In accordance with another aspect of the present invention, there is provided a method for forming a titanium silicide layer. The method includes the steps of implanting a species of ionic molecule including titanium and boron into a silicon surface, and annealing the silicon surface to cause the titanium to react with the silicon.

In accordance with a further aspect of the present invention, there is provided a method for simultaneously forming a P-type region and a titanium silicide layer in silicon. The method includes the steps of implanting a species of ionic molecule containing titanium and boron into the silicon, and annealing the silicon to cause the boron to dissociate from the titanium and to cause the titanium to react with the silicon.

In accordance with yet another aspect of the present invention, there is provided a method for forming a silicided contact. The method includes the steps of etching a contact to expose an underlying silicon surface, implanting a species of ionic molecule containing titanium and boron into the silicon surface, and annealing the silicon surface to cause the titanium to react with the silicon surface.

In accordance with still another aspect of the present invention, there is provided a method for forming a titanium silicided contact to a P-type region. The method includes the steps of etching a contact to expose an underlying silicon surface, implanting a species of ionic molecule containing titanium and boron into the silicon surface, and annealing the silicon surface to cause the boron to dissociate from the titanium and to cause the titanium to react with the silicon surface.

In accordance with a still further aspect of the present invention, there is provided a P-type implant. The implant includes a substrate having an annealed implant of a species of molecule containing titanium and boron.

In accordance with a yet further aspect of the present invention, there is provided a titanium silicide layer. The titanium silicide layer includes a silicon substrate having an annealed implant of a species of molecule containing titanium and boron.

In accordance with another aspect of the present invention, there is provided an integrated circuit that includes a substrate and a P-type region in the substrate having an annealed implant of a species of molecule containing titanium and boron.

In accordance with a further aspect of the present invention, there is provided an integrated circuit that includes a silicon surface and a titanium silicide layer at the silicon surface having an annealed implant of a species of molecule containing titanium and boron.

BRIEF DESCRIPTION OF THE DRAWINGS

Certain advantages of the invention will become apparent upon reading the following detailed description of specific embodiments and upon reference to the drawings in which:

FIG. 2 is a cross sectional view of a silicon wafer showing the status of the wafer after boron dissociation and silicidation after post-implant annealing.

FIG. 3 is a cross sectional view of a contact that has been silicided by the use of the disclosed process.

DETAILED DESCRIPTION OF SPECIFIC EMBODIMENTS

Figure 1:
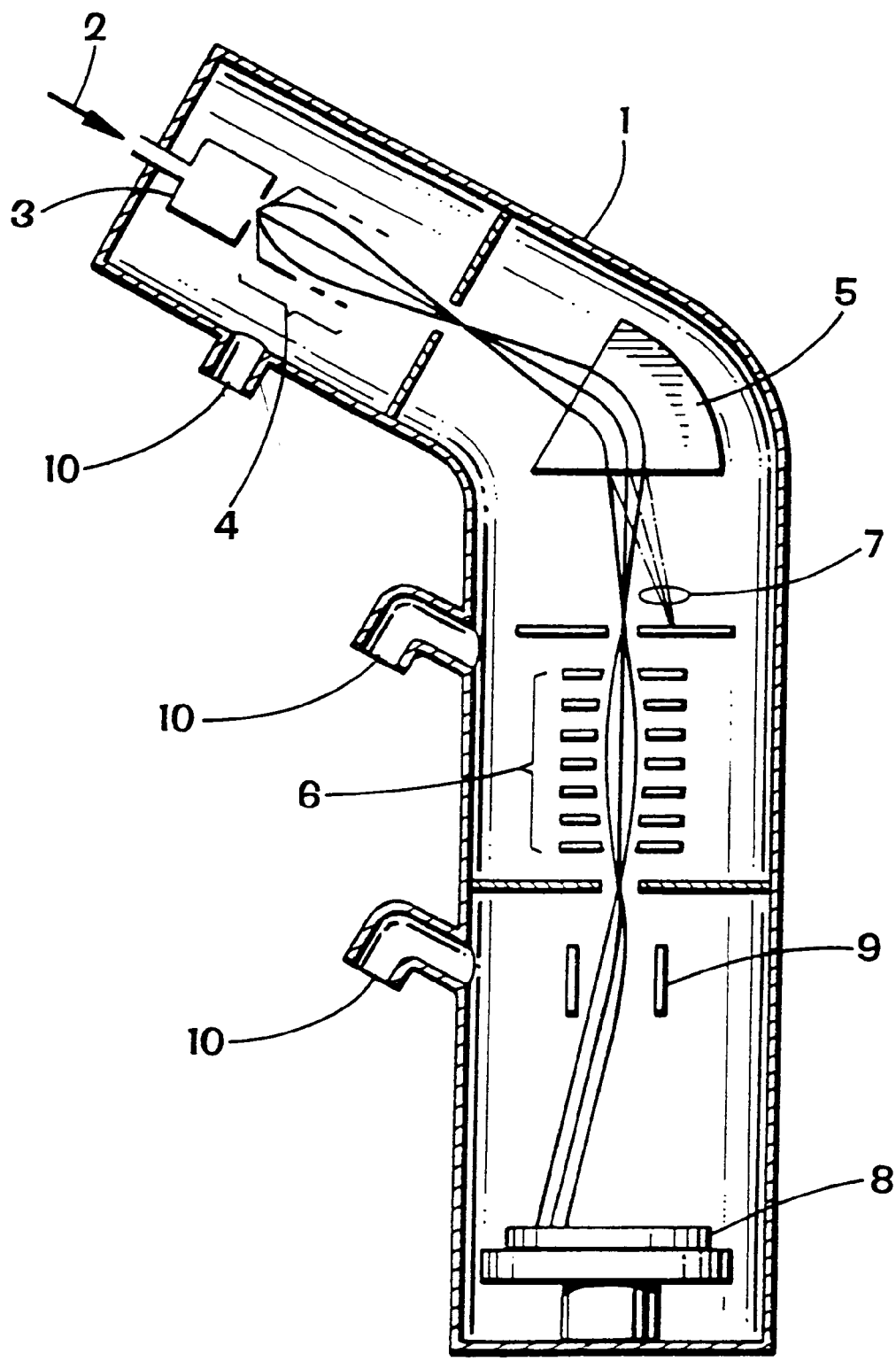
FIG. 1 is a cross sectional representation of an ion implanter showing its component parts.

In one embodiment, a combination of titanium tetrachloride ($TiCl_4$) and diborane ($B_2H_6$) source materials are used to create a $TiB_x^+$ species suitable for forming a shallow and pure P-type junction. To facilitate the description of the disclosed embodiment, FIG. 1 shows a representation of an ion implanter 1. Source materials enter the ion implanter 1 through port 2 that is coupled to a source chamber 3. In conventional ion implantation procedures, the source materials are usually cases. The gases are ionized into a gas plasma in the source chamber 3. The positively ionized ion species are then extracted by a negatively biased extractor 4 and sent to a charge-to-mass analyzer 5. The charge-to-mass analyzer 5 provides a magnetic field which is designed to select an ion species of a certain charge-to-mass ratio and send that species into the accelerator 6. Those ion species 7 which do not have the proper charge-to-mass ratio are deflected away from the accelerator 6. Those chosen ion species which reach the accelerator 6 are accelerated for eventual impact into the silicon wafer 8. Electrostatic deflectors 9 allow the ion beam to be rastered, or scanned, over the surface of the silicon wafer 9 for uniform ion implantation over the surface of the silicon wafer 8. Various pumps 10 are used to control the pressures inside of the different regions of the ion implanter 1. Example of standard ion implanters capable of performing this method are the Varian™ E1000 and E500 models.

In the illustrated embodiment, $TiCl_4$ and $B_2H_6$ are used as the source materials, although other Ti and boron sources may be substituted for $TiCl_4$ and $B_2H_6$. While $B_2H_6$ is a gas, $TiCl_4$ is a liquid. To produce a suitable amount of $TiCl_4$ gas to partake in ionization, the $TiCl_4$ liquid is heated to 40 degrees Centigrade. Because $TiCl_4$ has a relatively high vapor pressure, treatment of the $TiCl_4$ under these conditions will produce a sufficient amount of $TiCl_4$ gas to participate in ionization. Typically, the $TiCl_4$ source material is converted into vapor outside of the ion implanter 1 before being administered into the source chamber 3.

After a sufficient amount of $TiCl_4$ and $B_2H_6$ gases is introduced into the source chamber 3, both the $TiCl_4$ and $B_2H_6$ reactant species are ionized. The ionization of the reactant species will give rise to several different ionic species. After the reactant species are ionized, the ions react and form, among other species, some form of $TiB_x$ ion. Examples of the TiBx ion species are $TiB^+$ and $TiB_2^+$, but similar ions with a double-positive charge may also exist (e.g., $TiB_2^{++}$) depending on the RF power provided to the plasma. The use of the $TiB_2^+$ species in the disclosed process is advantageous because it should exist in higher concentrations than, for example $TiB_2^{--}$, and is also advantageous because of its mass, as will be explained later. The $TiB_2^+$ species is then extracted and accelerated through the ion implanter 1 and is ultimately implanted into the silicon wafer 8.

The use of these source materials exhibits distinct advantages. Because a $BF_2^+$ species is not used, molybdenum contamination is eradicated. Because the $TiB_2^+$ species has a different charge to mass ratio than does $Mo^{++}$, the extraction of the $TiB_2^+$ species will not simultaneously extract any $Mo^{++}$ species that happens to be present. Also, because the $TiB_2^+$ species has a relatively high molecular weight when compared with $BF_2^+$, shallower implants are created for a given accelerating voltage, such as that produced by accelerator 6. Moreover, because the $TiB_2^+$ species is heavier than $BF_2^+$, the $TiB_2^+$ species will create more damage to the silicon crystalline surfaces upon impact. This disruption of the crystalline lattice reduces or prevents ion channeling common with ion implantation procedures and helps to keep the junction shallow.

After implantation, an anneal process is performed. Typical, but not exclusive parameters for this rapid thermal anneal process are disclosed: time=5 to 60 seconds; temperature=500 to 900 degrees Centigrade; ambient=argon or other inert gases. Nitrogen based gases can also be used as the ambient, and these will form a thin barrier of titanium nitride over exposed silicon surfaces, which may be beneficial depending on the process at issue. A furnace anneal for 1 to 120 minutes at 500 to 900 degrees Centigrade may also be used. Furthermore, a combination of a plasma anneal, rapid thermal anneal, and a furnace anneal may be used.

The anneal serves a number of purposes, as shown in the wafer cross-section illustrated in FIG. 2. First, the anneal heals the damage to the silicon crystalline lattice 22 that occurs when the $TiB_2^+$ 23 enters the crystal. Second, the anneal allows the boron to dissociate from the titanium and diffuse through the silicon crystalline lattice 22 to form the desired P-type region 20. Third, the titanium, which is a relatively large molecule, will not be as prone to diffusing in the silicon and instead will stay at the original silicon surface. The high temperature of the anneal will allow the titanium to react with the silicon in the crystal, thus forming a titanium silicide alloy ($TiSi_x$) 21 at the surface of the silicon.

The simultaneous formation of $TiSi_x$ upon anneal after the use of the disclosed process has a number of advantages. First, P-type junctions can be created which do not require a separate silicidation process. Because a silicide is already formed by virtue of implantation of $TiB_2^+$ and anneal, the resulting P-type junctions are not only shallow and pure, but are of low resistance as well. Low resistance junctions are beneficial to improving chip speed, as one skilled in the art is aware.

Second, implantation of $TiB_2^+$ can also be used to form low resistance contacts as well. In ULSI technologies, it is becoming more difficult to form contacts of sufficiently low resistance due to the high aspect ratio of the contacts. Referring to FIG. 3, a contact hole 31 has been anisotropically etched through an oxide 32 to expose either an underlying transistor gate or junction (a junction 37 is shown in FIG. 3). The aspect ratio is defined as the height of the contact 33 divided by the width of the contact 34. As contact widths grow smaller in ULSI technologies, the aspect ratio grows higher. High aspect ratios make it difficult to sputter metals, such as titanium, into the bottom 36 of the contacts. Because sputtered titanium typically provides poor coverage inside of the contacts, the resulting contacts will have undesirably high resistances, which can degrade chip speed. However, by implanting $TiB^{2+}$ into the contact holes 31, a uniform titanium silicide layer 36 can be produced by the post-implantation anneal, thus improving contact resistance while obviating the need for a separate silicidation process step.

Silicidation of contacts by implantation of $TiB_2^+$, as shown in FIG. 3, can be performed in a number of ways. In one embodiment, $TiB_2^+$ implantation can take place after a junction 37 has already been formed by traditional methods. Adopting this approach, the junctions 37 are first formed. Then, an oxide 32 is formed and etched to form contact holes 31. The $TiB_2^+$ implantation and anneal are performed to form a titanium silicide 36.

Because boron will disassociate from the titanium silicide 36, the presence of the extra boron dopants should be taken into account when initially forming the junctions 37. For example, if the pre-existing junction 37 was a P-type junction, the presence of the dissociated boron would cause the junction 37 to become more heavily doped. This may dictate that the P-type junctions should initially be formed with a lower doping level than that which is ultimately desired, thus taking into account the fact that extra boron will be introduced into the junction by implantation and anneal. If the pre-existing junction 36 was a N-type junction, the presence of dissociated boron would counter-dope the N-type junction. This may dictate that the N-type junction should initially be formed with a higher doping level than that which is ultimately desired, thus taking into account the fact that boron will be introduced into the junction by implantation and anneal. N-type junctions can be masked off such that only the P-type junctions are implanted, if counter-doping of the N-type junctions is undesirable.

In another embodiment, $TiB_2^+$ implantation may be used to formed the P-type junctions, as well to provide the titanium used to form a titanium silicide. Adopting this approach, an oxide 32 is etched to form contact holes 31, and then $TiB_2^+$ is implanted and annealed, forming, simultaneously, titanium silicide 36 and a P-type junction 37. One benefit of this embodiment is that the P-type junctions 37 thus formed are self-aligned. As mentioned above, N-type junctions are formed by other methods, and may be masked off during the implantation process (unless N-type junction contact silicidation is desired).

Which embodiment should be chosen is subject to a number a factors, including manufacturing cost and junction engineering considerations. It should also be noted that through the use of either of the disclosed embodiments, the contact etch will also, in some manufacturing processes, simultaneously expose the transistor gates. Because most modem day transistor gates are composed of polysilicon, $TiB_2^+$ implantation into the gates will form a silicide, which should be beneficial by forming low resistance gate contacts. Extra-doping or counter-doping of the polysilicon is not expected to have the same repercussions as for junctions, since the degenerative nature of the polysilicon is less susceptible to such effects.

Although the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A P-type implant comprising a substrate having an annealed implant of a species of molecule containing titanium and boron.

2. The P-type implant of claim 1, wherein the species of molecule comprises $TiB_2^+$.

3. The P-type implant of claim 1, wherein the species of molecule comprises $TiB^+$.

4. A titanium silicide layer comprising a silicon substrate having an annealed implant of a species of molecule containing titanium and boron.

5. The titanium silicide layer of claim 4, wherein the species of molecule comprises $TiB_2^+$.

6. The titanium silicide layer of claim 4, wherein the species of molecule comprises $TiB^+$.

7. An integrated circuit comprising a substrate and a P-type region in the substrate having an annealed implant of a species of molecule containing titanium and boron.

8. The integrated circuit of claim 7, wherein the integrated circuit is a DRAM.

9. An integrated circuit comprising a silicon surface and a titanium silicide layer at the silicon surface having an annealed implant of a species of molecule containing titanium and boron.

10. The integrated circuit of claim 9, wherein the integrated circuit is a DRAM.

* * * * *